United States Patent [19]
Duan

[11] Patent Number: 6,000,834
[45] Date of Patent: *Dec. 14, 1999

[54] AUDIO SAMPLING RATE CONVERSION FILTER

[75] Inventor: Tieying Duan, Maple, Canada

[73] Assignee: ATI Technologies, Thornhill

[*] Notice: This patent issued on a continued prosecution application filed under 37 CFR 1.53(d), and is subject to the twenty year patent term provisions of 35 U.S.C. 154(a)(2).

[21] Appl. No.: 08/907,314

[22] Filed: Aug. 6, 1997

[51] Int. Cl.⁶ .................................................. G06F 17/17
[52] U.S. Cl. ........................................................ 364/724.1
[58] Field of Search ......................... 364/724.1, 724.13, 364/724.011

[56] References Cited

U.S. PATENT DOCUMENTS

| | | | |
|---|---|---|---|
| 4,344,149 | 8/1982 | Van de Meeberg et al. | 364/724.1 |
| 5,594,677 | 1/1997 | Grolla et al. | 364/724.1 |

OTHER PUBLICATIONS

Crochiere, Ronald E., and Rabiner, Lawrence R. Interpolation and Decimation of Digital Signals. *Proceedings of the IEEE*, vol. 6, No. 3 (Mar., 1981), pp. 300–331.

Hsiao, Chia–Chuan. Polyphase Filter Matrix for Rational Sampling Rate Conversions. *Proceedings of the IEEE, International Conference on ASSP* (Apr., 1987), pp. 2173–2176.

Vaidyanahan, P. P. Multirate Digital Filters, Filter Banks, Polyphase Networks, and Applications: A Tutorial. *Proceedings of the IEEE*, vol. 78, No.1 (Jan. 1990), pp. 56–93.

Adams, Robert, and Kwan, Tom. Theory and VLSI architectures for Asynchronous Sample–Rate Converters. *Journal of the Audio Engineering Society*, vol. 41, No. 7/8 (Jul./Aug., 1993), pp. 539–554.

Bellanger, Maurice G., Bonnerot, George, and Coudreuse, Michel. Digital Filtering by Polyphase Network: Application to Sample–Rate Alteration and Filter Banks. *IEEE Trans. Acoust. Speech Signal Proc.* vol. 24, (1976) pp. 109–114.

*Primary Examiner*—Tan V. Mai
*Attorney, Agent, or Firm*—Markison & Reckamp, PC

[57] ABSTRACT

A 1:2 or 2:1 audio sampling rate conversion filter converts audio signals from a first sampled rate to a second sampled rate has a multi-coefficient subfilter for receiving a plurality of audio signal samples from buffer memory obtained by sampling at the first sampled rate, and for performing convolution on the plurality of audio signal samples to generate a multi-coefficient based convolution product. In combination with the multicoefficient subfilter, the audio sampling rate conversion filter has a single coefficient subfilter for only receiving a middle sample from the buffer memory and for performing convolution on the middle sample using a single middle coefficient to generate a single middle coefficient based convolution product. The multi-coefficient based convolution product and the single middle coefficient based convolution product are used to convert the audio signal samples obtained at the first sampled rate to audio signal samples corresponding to signal samples obtained as if sampled at the second sampled rate. A commutator in combination with the multicoefficient and single coefficient subfilters is used to achieve a reduction in the number of multiplications required by the filter to obtain suitable rate converted signal samples.

12 Claims, 7 Drawing Sheets

1:2 INTERPOLATOR

2:1 DECIMATOR

AUDIO SAMPLING RATE CONVERSION FILTER

BACKGROUND OF THE INVENTION

The invention relates generally to audio sampling rate conversion FIR filters and more particularly to low pass audio sampling rate conversion FIR filters that perform interpolation and/or decimation by a factor of two such as 1:2 interpolation and/or 2:1 decimation.

The trend in multimedia computer systems is to have numerous audio sources, such as CD's, DVD's, stored audio files and digital satellite broadcast signals that can be mixed and need to be output through the computer to speakers. The audio signal to the speakers is typically specified at a different sampling rate than the audio sampling rate from the sources. In digital audio applications, standard sampling rates and conversions may be as shown below in Table 1.

TABLE 1

| original sampling rate (kHz) | new sampling rate (kHz) |
|---|---|
| 11.025 | 22.05 |
| 22.05 | 44.1 |
| 8 | 16 |
| 16 | 32 |

The individual data stream must each be converted to a common sampling rate of typically 48 kwps (kilowords per second). Mixing of these streams from the various sources may generally be accomplished by taking a stream at 8 kwps and converting it by a factor of two to 16 kwps and mixing the data with the stream at 16 kwps. In the same way, a 16 kwps stream is converted by a factor of two to 32 kwps stream and can be mixed with a stream at 32 kwps. The rate may also be in bytes per second or other suitable data size.

For example, where audio from a source or channel has been sampled at 8 kwps and the signal must be mixed with audio from another source that outputs sampled signals at a rate twice as much, such as 16 kwps, the audio signal must undergo 1:2 interpolation to provide twice as many samples for the same signal. Conversely, where the source audio has been sampled at twice the rate than audio it is to be mixed with, the signal must undergo filtering and be decimated to provide one-half as many samples for the same signal.

With many audio sources and a limited amount of computer processing capability and memory in multimedia systems (and audio telecommunication systems), efficient sampling rate conversion is necessary. Generally, during interpolation or decimation, a digital filter must perform multiplications for each filter coefficient to determine a corresponding signal value. Each multiplication step requires processing time. A typical sampling rate converter uses a half-band FIR filter for performing all of the interpolation and decimation. Such filters, as known in the art, use nearly one-half the number of filter coefficients compared to a normal FIR filter while providing a similar signal to noise quality level. For example, where a 96 dB S/N ratio is desired, a normal FIR filter may require the use of 60 filter coefficients whereas the halfband FIR filter may only require about 30 coefficients. However, such filters still require input samples with zero values inserted so the number of multiplication operations is still higher than desired. Operation of a standard half band filter is shown in FIG. 1.

Another type of rate converter uses a poly-phase FIR filter (or filters) to perform all interpolation or decimation. The poly-phase FIR filter is more efficient than a conventional FIR filter because it skips the zero values inserted. However, such filters still require a large number of coefficients so that additional audio conversion will be slower than necessary to accommodate mixing of numerous audio sources.

Consequently, there exists a need for an improved audio sampling rate conversion filter that performs interpolation and/or decimation by a factor of two such as 1:2 interpolation and/or 2:1 decimation. It would be advantageous if such a filter required fewer coefficients and processing time to convert audio signals.

BRIEF DESCRIPTION OF THE SEVERAL VIEWS OF THE DRAWINGS

The features of the present invention together with the advantages thereof, may be understood by reference to the following description taken in conjunction with the accompanying drawings wherein:

FIG. 4b is a flow diagram generally depicting the operation of the audio sampling rate conversion filter configured as an interpolator of FIG. 4a;

FIG. 5 is a graphical representation of the audio sampling rate conversion filter configured as an interpolator of FIG. 4a;

FIG. 6b is a flow diagram depicting the operation of the decimator shown in FIG. 6a;

FIG. 7 is a graphical representation of the decimator shown in FIG. 6a; and

DETAILED DESCRIPTION OF THE INVENTION

Figure 1:
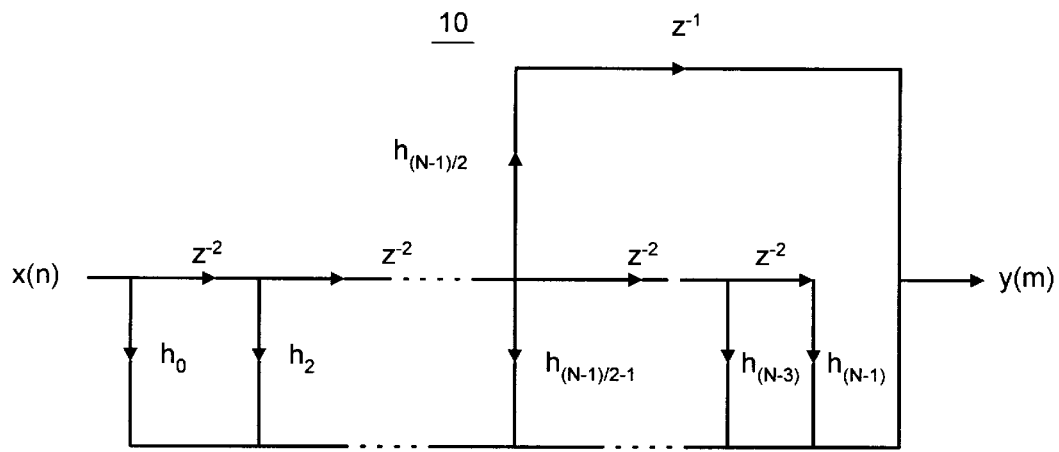
FIG. 1 graphically depicts a conventional half-band filter.

FIG. 1 shows a conventional half-band filter where all of the odd coefficients except the middle coefficient are zero. As shown, z is a time delay and h is a filter coefficient. The middle coefficient is represented by $h_{(N-1)/2}$, where N=the original number of coefficients in a standard FIR filter. With conventional half-band filters, (N+3)/2 multiplications are required to generate two output samples where one sample is tapped in. The first output sample of y(m) is evaluated by convoluting the filter's coefficients, except the middle coefficient, and (N+1)/2 input samples x(n) with zeros inserted. The second output sample of y(m) is generated by multiplying the middle coefficient $h_{(N-1)/2}$ and one of the input samples x(((N−1)/2+1)/2). Hence the number of coefficients are reduced to about 31 non-zero coefficients, where N=59. Although this is an improvement over standard FIR filters, the halfband FIR filter still requires time consuming multiplication processing with the zero insertions or discarding every other output sample for rate conversion when performing interpolation or decimation by a factor of two.

Figure 2:
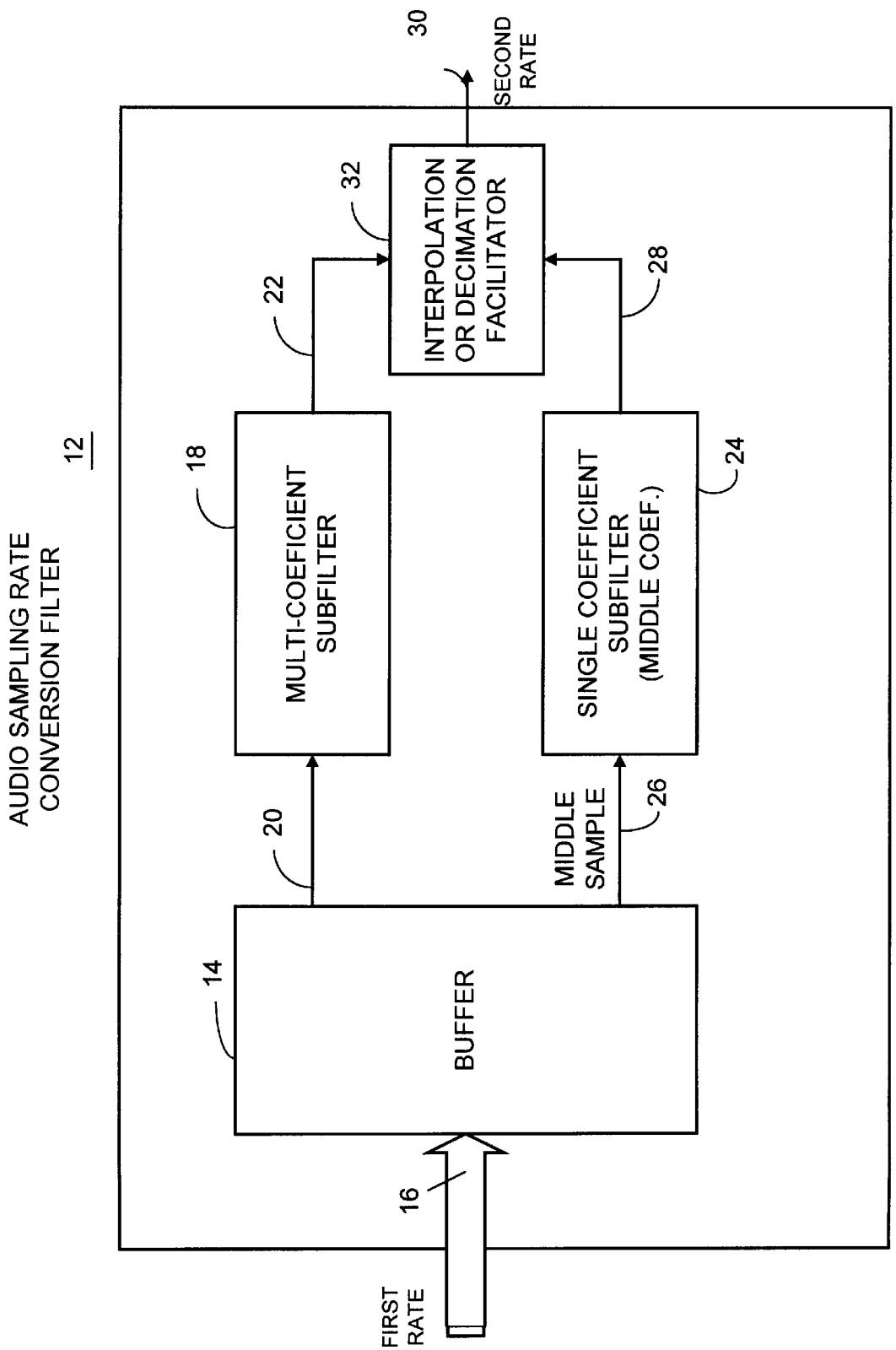
FIG. 2 is a block diagram generally depicting an audio sampling rate conversion filter for converting audio signals from a first sampled rate to a second sampled rate in accordance with the invention.

FIG. 2 shows one embodiment of an audio sampling rate conversion filter 12 for converting audio signals by a factor of two from a first sampled rate to a second sampled rate having a buffer 14 that receives audio signal samples 16 sampled at a first rate. The audio sampling rate conversion filter 12 includes a multi-coefficient subfilter 18 that receives audio signal samples 20 from the buffer 14 for performing convolution on the audio signal samples 20 to generate a multi-coefficient based convolution product 22 for use in interpolation or a decimation. The audio sampling rate conversion filter 12 further includes a single coefficient subfilter 24 that receives only a middle sample 26 from the buffer 14. This single coefficient subfilter 24 performs convolution on the middle sample 26 using a single middle coefficient to generate a single middle coefficient based convolution product 28 for use in interpolation or a decimation. Both the multi-coefficient based convolution product 22 and the single middle coefficient based convolution product 28 are used to convert the audio signal samples 16 to audio signal samples corresponding to output signal samples 30 obtained as if sampled at the second rate.

The audio sampling rate conversion filter 12 further includes an interpolation or decimation facilitator 32 which receives the multi-coefficient based convolution product 22 and the single middle coefficient based convolution product 28 and either outputs the convolution products 22 and 28 sequentially to facilitate interpolation or adds the convolution products 22 and 28 together to facilitate decimation. Where the audio sampling rate conversion filter 12 is configured as an interpolator, the first rate may be for example audio signal samples sampled at 8 kwps per second and the output data 30 is doubled to a rate of 16 kwps per second to perform a 1:2 interpolation. Conversely, if the audio sampling rate conversion filter 12 is configured as a decimator, audio signal samples 16 having been sampled at a rate of 16 kwps per second are decimated, or reduced in number by a factor of two, so that the output audio signal data 30 is reflective of signal data sampled at a 8 kwps per second sample rate. By using the combination of the single coefficient subfilter 24 that convolves using only the middle coefficient and the multi-coefficient subfilter 18 in combination with a commutator operation, the number of filter multiplications is greatly reduced and can be reduced by a factor of 4 thereby effecting a faster rate conversion filter.

Figure 3:
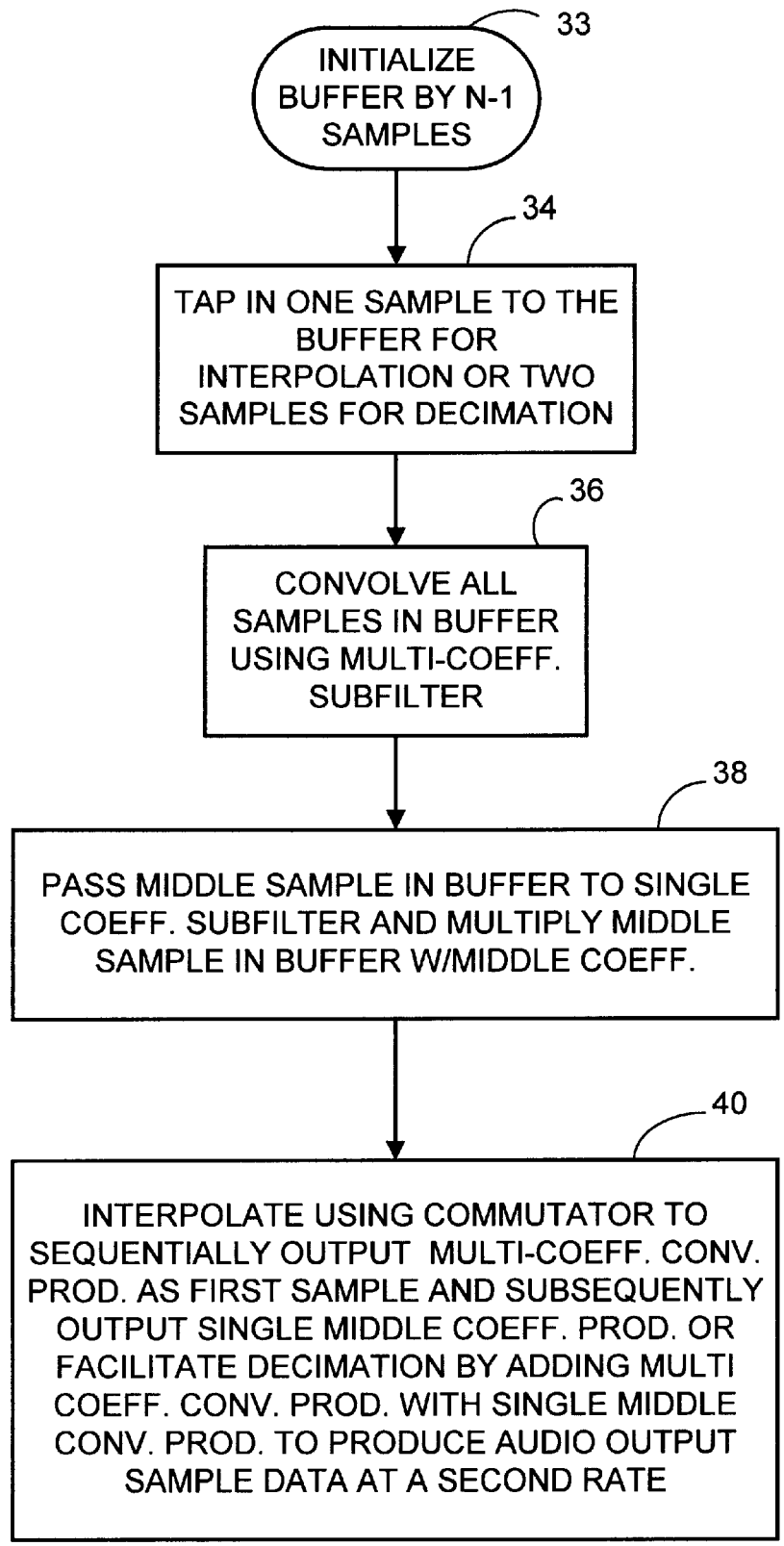
FIG. 3 is a flow diagram generally depicting the operation of the audio sampling rate conversion filter shown in FIG. 2.

FIG. 3 shows the general operation of the audio sampling rate conversion filter of FIG. 2 wherein buffer 14 is initialized by storing a number of samples equal to N−1 as shown in block 33. Depending upon the type of rate conversion desired, the buffer may be a single circular buffer or dual buffer. Once the buffer 14 has been initialized, another sample is tapped into the buffer 14 where the filter is configured as an interpolator, or two samples are tapped into each of the buffers in a dual buffer configuration when the filter is configured as a decimator. This is indicated in block 34. All of the samples stored in buffer 14 are then convolved by the multi-coefficient subfilter 18. This is shown in block 36.

The multi-coefficient subfilter 18 performs the convolution according to the following formula:

$$y(m) = \sum_{i=0}^{29} h(i)x(m-i)$$

to obtain one converted sample y(m). The multi-coefficient subfilter through the convolution process generates the multi-coefficient based convolution product 22. Next, middle sample 26 is passed from buffer 14 to the single coefficient subfilter 24. The single coefficient subfilter 24 contains the value of the middle coefficient only. The single coefficient subfilter multiplies the middle sample 26 with the middle coefficient to generate the single middle coefficient based convolution product 28 as shown in block 38 according to the following equation:

$$y(m+1) = h_{mid} * x(m-15)$$

The disclosed filter is very efficient because it takes advantage of both features of the half-band filter with nearly half the number of non-zero coefficients and that of the polyphase structure using a commutator without filling-in input samples with zero-values when interpolating and without calculating the input samples with redundant information when decimating. Therefore, an average of 15.5 multiplications are required for an output sample for N=59. This is nearly one fourth of the number of multiplications required for a conventional FIR filter.

The audio sampling rate conversion filter 12 performs interpolation by using a commutator to sequentially first output the multi-coefficient based convolution product 22 and subsequently outputs the single middle coefficient based convolution product 28 to perform 1:2 interpolation. When the interpolation or decimation facilitator 32 is to be used for decimation, the decimation facilitator 32 adds the multi-coefficient based convolution product to the single middle coefficient based convolution product to perform 2–1 decimation. The resulting data from the interpolation or decimation facilitator 32 is the output data 30 representing data as if sampled at the second rate.

Figure 4A:
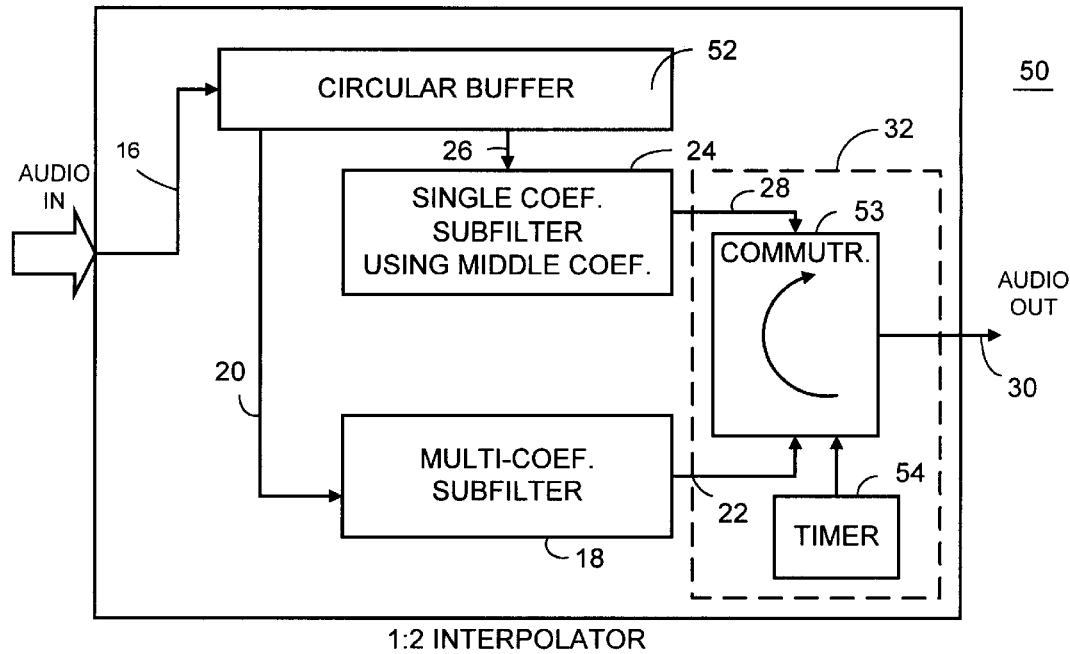
FIG. 4a is a block diagram depicting in more detail one embodiment of an audio sampling rate conversion filter configured as a 1:2 interpolator.

FIG. 4a shows the audio sampling rate conversion filter 12 configured as an audio sampling rate conversion interpolator filter 50. The audio rate conversion interpolator filter 50 preferably uses a circular buffer 52 as buffer 14. The circular buffer 52 is sized to store a same number of audio signal samples as a number of coefficients in the multi-coefficient subfilter 18. The circular buffer 52 is a single buffer that stores the audio signal sample data 16 for the multi-coefficient subfilter 18 and the single coefficient subfilter 24. Preferably, the rate conversion filter 50 is in a digital signal processor (DSP) that serves as a component in an audio playback device in a multimedia computer system for mixing converted sampled audio signals in the form of audio signal sample data 16 with other sampled audio signals. As shown in FIG. 4a, the multi-coefficient subfilter 18 and a single coefficient subfilter 24 are configured to perform 1–2 interpolation.

To facilitate the interpolation process, the audio rate conversion interpolator 50 includes commutator circuit 53 that receives the multi-coefficient based convolution product 22 and the single middle coefficient based product 28. The commutator circuit 53 first outputs the multi-coefficient based convolution product 22 and subsequently outputs the single middle coefficient convolution product 28 to perform the 1:2 interpolation. Timer circuit 54, which may be a clock or pulse from a central processing unit provides the commutator circuit 53 with timing signals so that the commutator circuit 53 switches to sequentially output the multi-coefficient based convolution product 22 and then the single middle coefficient based convolution product 28 as output data 30. It will be recognized that where the convolution is performed in software, the timer circuit 54 is not necessary since the order of performing convolution for the multicoefficient subfilter 18 and the single coefficient subfilter 24 may be sequenced to effect the proper output order of the convolution products 22 and 28.

Figure 4B:
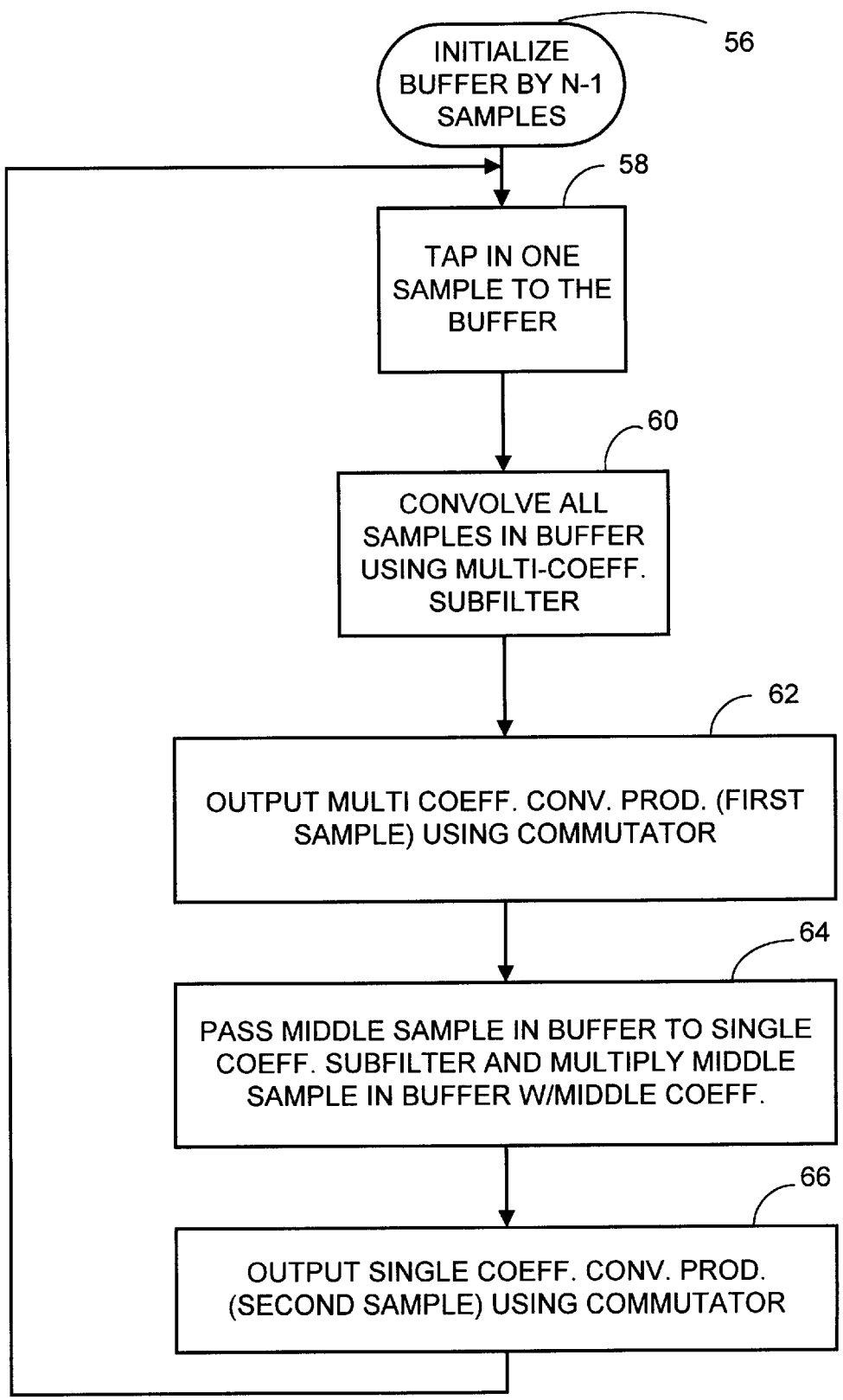

FIG. 4b shows the operation of the audio rate conversion interpolation filter 50 which operates by first initializing the circular buffer 52 with a number of audio samples equal to N−1 as shown in block 56. For example, if N=30, during the initialization process of block 56, the circular buffer 52 is initialized with 29 samples. The circular buffer 52 then receives another sample (tapped) as indicated in block 58.

As shown in block 60, the multi-coefficient subfilter 18 convolves all samples in the circular buffer based on the equation shown above (with reference to FIG. 3) using conventional convolution techniques. The multi-coefficient subfilter 18 outputs the multi-coefficient convolution product sample 22 which the commutator circuit 53 outputs as audio signal data 30 as shown in block 62. The single coefficient subfilter 24 receives the middle sample 26 and multiplies the middle sample with a middle coefficient ($h_{mid}$) as shown in block 64 thereby producing the single middle coefficient based convolution product 28 which is output by the commutator circuit 53 as a second sample after the multi-coefficient convolution based product has been output. This is shown in block 66. The process is then repeated for each sample in the circular buffer. In this way, a 1–2 interpolation is performed by audio rate conversion interpolator filter 50 using both a commutator and halfband convolution techniques. Using this configuration, no zeros are inserted thereby reducing the processing steps required by the DSP. The multi-coefficient based convolution product 22 and then the single middle coefficient based convolution product 28 are added for each sample during decimation.

Figure 5:
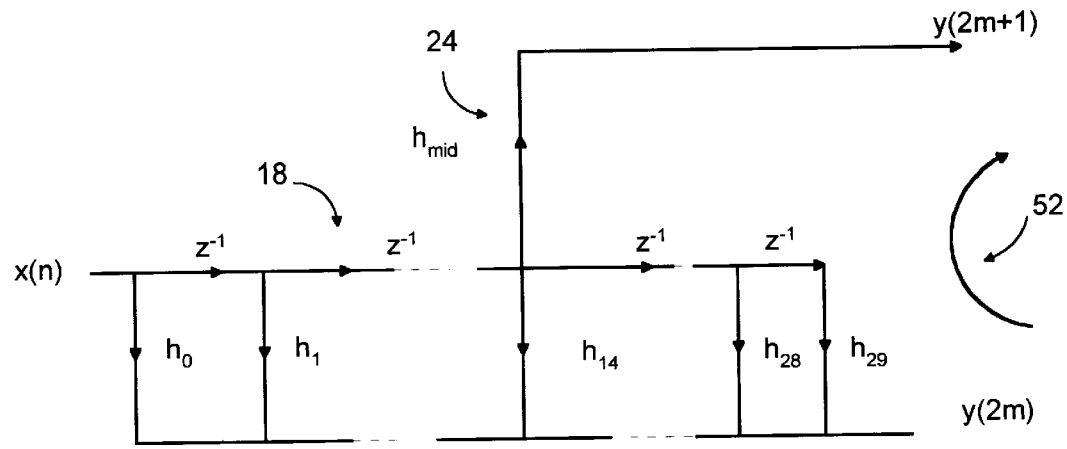

FIG. 5 graphically illustrates the operation of the audio rate conversion interpolator filter 50 for N=59. As shown, 30 non-zero coefficients ($h_0$–$h_{29}$) and the middle coefficient ($h_{mid}$) are used. Compared with the standard halfband FIR filter of FIG. 1, the audio rate conversion interpolator filter 50 utilizes a polyphase commutator approach in addition to halfband techniques. Therefore, no zeros are added as input samples. Hence the audio rate conversion interpolator filter 50 is also referred to herein as a half-band polyphase filter.

Figure 6A:
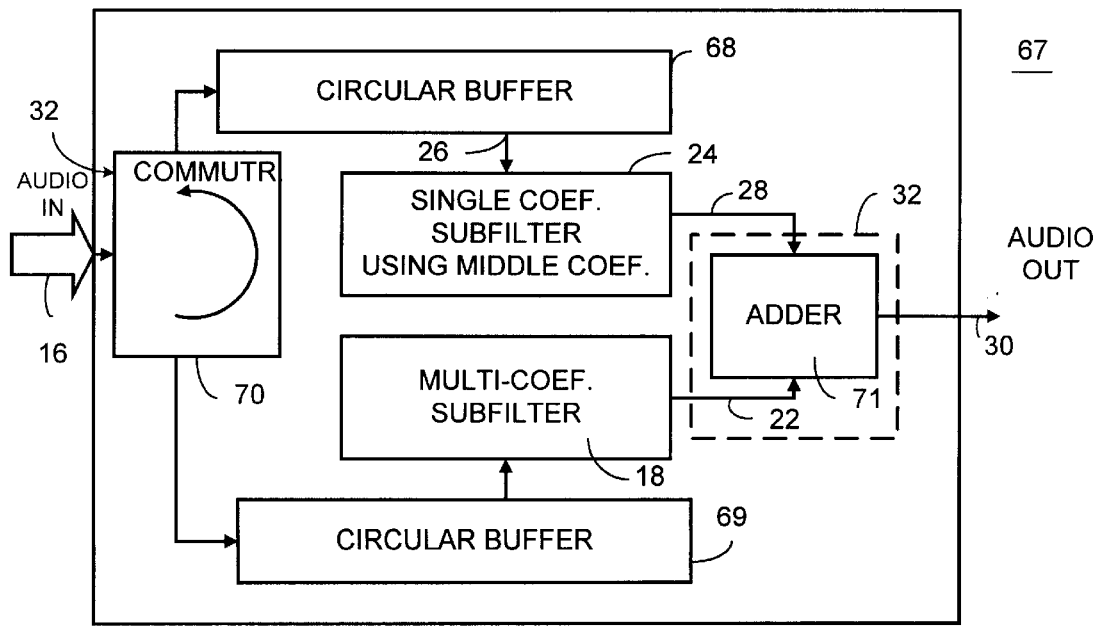
FIG. 6a is a block diagram depicting one embodiment of an audio sampling rate conversion filter configured as a 2:1 decimator in accordance with the invention.

FIG. 6a is a block diagram of an audio sampling rate conversion decimator filter 67 for converting audio signal samples from a 2:1 rate. The audio sampling rate conversion decimation filter 67 includes two separate memory sections shown as circular buffer 68 and circular buffer 69. Circular buffer 69 stores sampled audio signal data for the multi-coefficient subfilter 18, and circular buffer 68 stores sampled audio signal data for the single coefficient subfilter 24. When configured as a decimator, the interpolation and decimation facilitator 32 (FIG. 2) includes an input commutator circuit 70 and an output adder circuit 71.

The input commutator circuit 70 outputs received audio signal samples 16 to both separate memory sections circular buffers 68 and 69 and selectively directs the received audio samples 16 to one or the other of the separate memory sections. The output adder circuit 71 receives the multi-coefficient based convolution product 22 and the single middle coefficient based convolution product 28 and adds the multi-coefficient based convolution product 22 to the single coefficient based convolution product 28 to perform 2:1 decimation. As such, the multi-coefficient subfilter 18 and the single coefficient subfilter 24 are configured to perform 2:1 decimation.

Preferably, the audio rate conversion interpolator filter 50 is a separate filter within a digital signal processor and the audio rate conversion decimator filter 67 serves as another filter within the same digital processor. Although shown with the same reference numerals, the single co-efficient subfilter and multi-coefficient subfilter for each of the audio rate conversion decimator filter 67 and the audio rate conversion interpolator filter 50 are preferably separate filters in the digital signal processor.

Figure 6B:
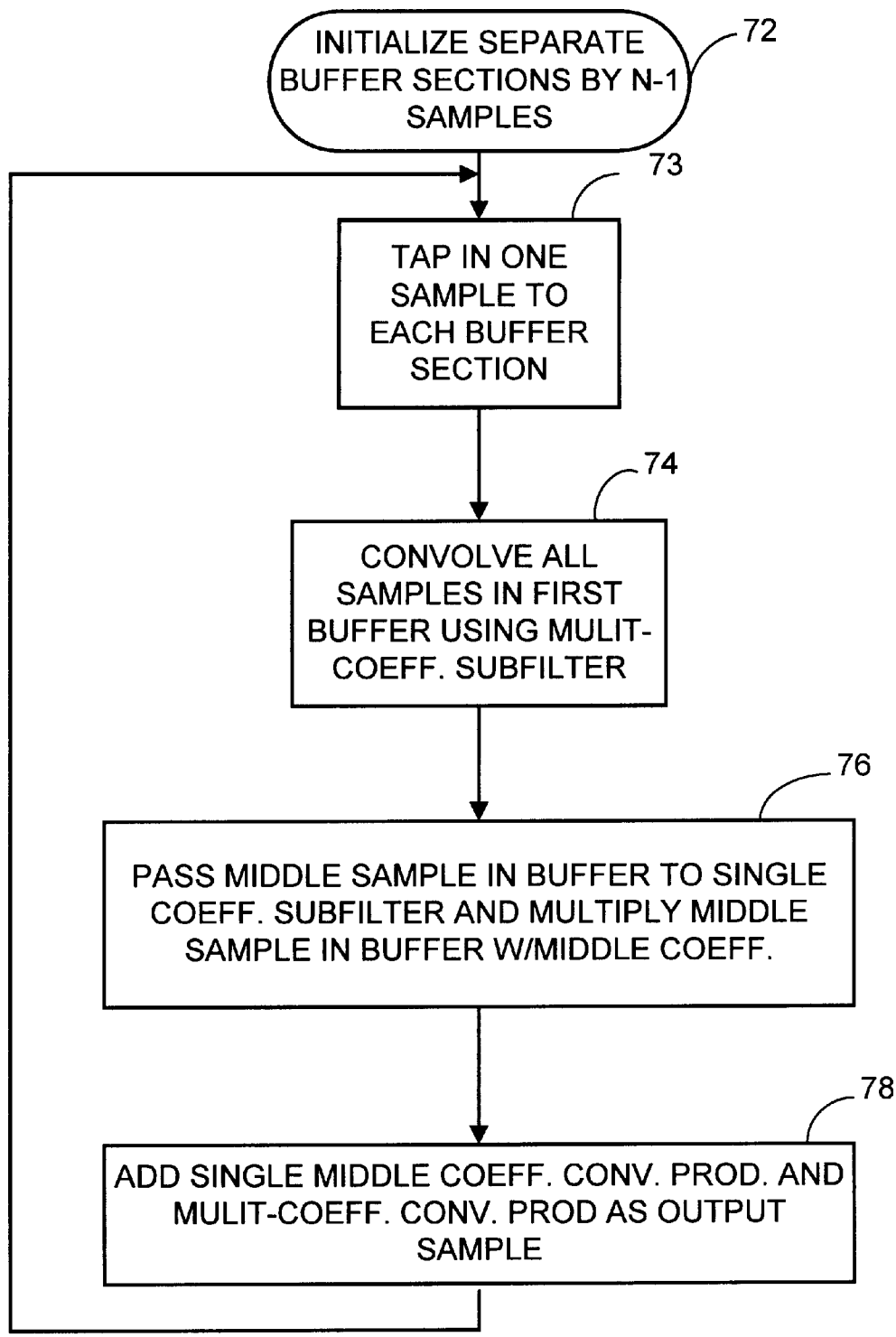

FIG. 6b shows the operation of the audio rate conversion decimator filter 67 wherein the circular buffer 68 and circular buffer 69 are initially initiated as shown in block 72 by storing N−1 samples in each buffer. One sample is then tapped into each of the circular buffers 68 and 69 as shown in block 73. The multi-coefficient subfilter 18 then performs convolution on all samples in circular buffer 69 as shown in block 74. The single coefficient subfilter 24 multiplies the middle sample value in circular buffer 68 with the middle coefficient value as shown in block 76 to generate the single middle coefficient based convolution product 28. The adder circuit 71 then adds the two convolution products, namely the multi-coefficient based convolution product 22 and the single middle coefficient based convolution product 28 as indicated in block 78 thereby producing the output signal data 30. This process is repeated for each sample that is tapped into the buffers 68 and 69.

It is preferred that both the audio rate conversion interpolator filter 50 (FIG. 4a) and the audio rate conversion decimator filter 67 serve as an audio sampling rate conversion filter in a digital signal processor. In this configuration, the audio sampling rate conversion filter includes a 1:2 interpolation filter stage namely audio rate conversion interpolator filter 50 for receiving a plurality of audio signal samples from buffer memory 52, and for performing convolution on the plurality of audio signal samples to generate the multi-coefficient based convolution product 22. The audio sampling rate conversion filter also includes the single coefficient subfilter 24 for only receiving a middle sample 26 from the buffer memory 52 and for performing convolution on the middle sample 26 using a single middle coefficient to generate the single middle coefficient based convolution product 28. The commutator 53 receives the multi-coefficient based convolution product 22 and the single middle coefficient based convolution product 28 and outputs the multi-coefficient based convolution product 22 and subsequently outputs the single middle coefficient based convolution product 28 to perform 1:2 interpolation.

The 1:2 interpolation filter stage 50 also includes timer 54 for controlling when the commutator 53 switches to pass either the multi-coefficient based convolution product or the single middle coefficient based convolution product. The buffer 52 is a single buffer that stores the audio signal sample data for both the multi-coefficient subfilter and the single coefficient subfilter.

Where the input audio signal samples must be decimated, the 2:1 decimator filter stage 60 includes another multi-coefficient subfilter (18 in FIG. 6a) for receiving the plurality of audio signal samples from buffer memory 64, and for performing convolution on the plurality of audio signal samples to generate the multi-coefficient based convolution product (22 of FIG. 6a). Another single coefficient subfilter (24 of FIG. 6a) for only receiving a middle sample from another buffer memory 62 and for performing convolution on the middle sample using a single middle coefficient to generate another single middle coefficient based convolution product (28 of FIG. 6a). The decimator stage 60 includes another commutator 66 coupled to the buffer memories 62 and 64, for selectively directing the set of received audio signal samples to one or the other of the memory sections 62 and 64. An adder 68 receives the multi-coefficient based convolution product (22 in FIG. 6a) and the single middle coefficient based convolution product (28 in FIG. 6a), for adding the multi-coefficient based convolution product to the single middle coefficient based convolution product to perform 2:1 decimation.

Figure 7:
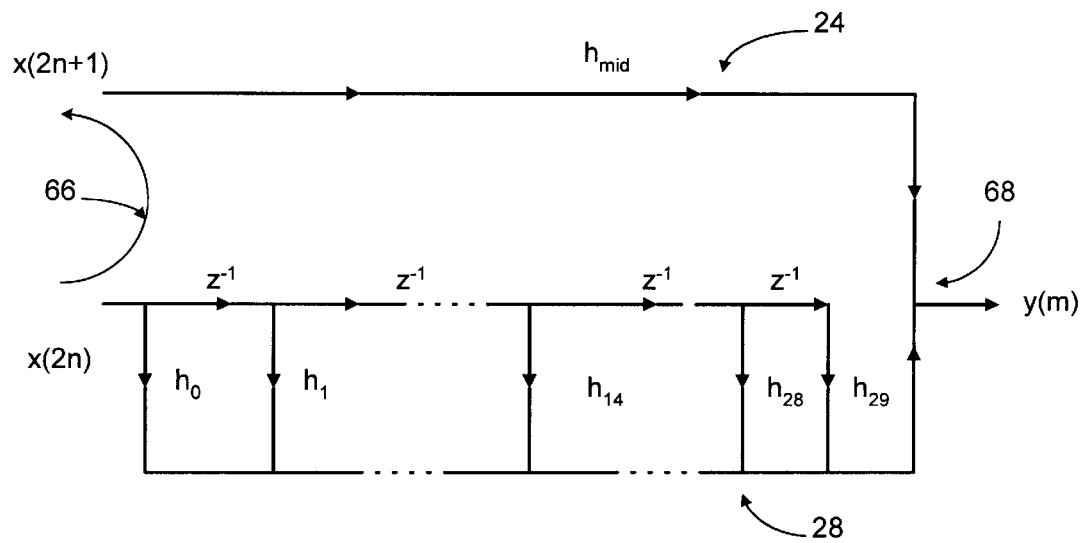

FIG. 7 is a graphic illustration of the audio rate conversion decimation filter 67 for N=59. As shown, 30 non-zero coefficients ($h_0$–$h_{29}$) and the middle coefficient ($h_{mid}$) are used. Again, compared with the standard halfband FIR filter of FIG. 1 or a conventional polyphase FIR filter, the audio rate conversion decimator filter 67 utilizes a polyphase commutator approach in addition to halfband techniques. Hence the audio rate conversion decimator filter 67 is also referred to herein as a half-band polyphase filter.

Figure 8:
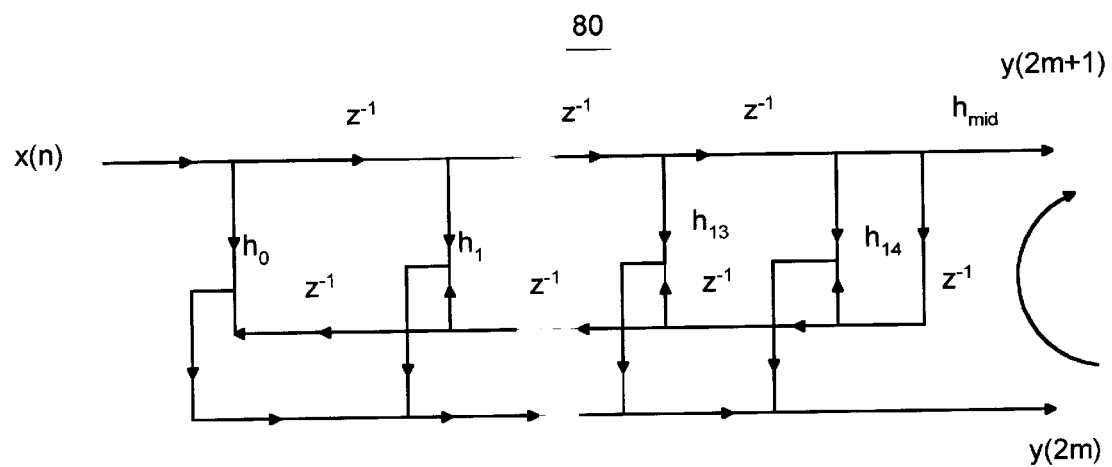
FIG. 8 is a graphical depiction of another embodiment of an audio sampling rate conversion filter configured as an interpolator in accordance with the invention.

FIG. 8 graphically illustrates another audio sampling rate conversion filter 80 embodiment to further reduce computational complexity by reducing the number of multiplications performed by the DSP. With some processors, addition steps and multiplication steps can be performed in one clock cycle. However, where a processor is structured to perform a multiplication step and addition step in two or three clock cylces (non-pipeline processing), the audio sampling rate conversion filter 80 uses half the number of coefficients as the filter in FIG. 5 by adding samples and multiplying the added samples once. As seen, the number of coefficients is 15 versus 29 in FIG. 5.

As seen from above, an advantage of the disclosed audio sampling rate conversion filter is to reduce the number of multiplications required during processing to nearly half of the number compared with conventional polyphase filters and conventional half-band filters. The half-band polyphase filter 12 is a combination of half-band and polyphase techniques. Nearly half of the number of the filter coefficients are zero. On the other hand a right commutator (for interpolation) or a left commutator (for decimation is used so that filling in input samples with zero values when interpolating is not needed and calculating the input samples with redundant information for decimation, is no longer needed. Therefore, approximately ¼ of the number of multiplications required for a conventional FIR filter is required for the disclosed audio sampling rate conversion filter.

As such, the disclosed audio sampling rate conversion filter converts the digital audio samples from one sampling rate to another sampling rate by a factor of two so that 1:2 interpolation occurs or 2:1 decimation occurs.

An example of suitable filter coefficients for three sets of signal to noise ratios 98.8 dB, 81.2 dB and 70 dB appear below. The filter coefficients were calculated using the Remez exchange algorithm of the optimal design.

SET I

Where
N=59, the number of non-zero coefficients=31, pass-band ripple=0.0001 dB,
stop-band ripple=−98.8 dB,
output efficiency=15.5 multiplications.
half-band polyphase filter coefficients:

$h_{mul}$ (coefficients for the multiple coefficient subfilter) =
3.50460308e − 005, −1.21492477e − 004, 3.17219744e − 044, −6.98412128e − 004,
1.37230274e − 003, −2.48094963e − 003, 4.20765059e − 003, −6.78971019e − 003,
1.05483197e − 002, −1.59614025e − 002, 2.38492812e − 002, −3.58989895e − 002,
5.64696357e − 002, −1.01638920e − 002, 3.16796159e − 001, 3.16796159e − 001,
−.01638920e − 001, 5.64696357e − 002, −3.58989895e − 002, 2.38492812e − 002,
−1.59614025e − 002, 1.05483197e − 002, −6.78971019e − 003, 4.20765059e − 003, −2.48094963e − 003, 1.37230274e − 003, −6.98412128e − 004, 3.17219744e − 004, −1.21492477e − 004, 3.50460308e − 005 };
$h_{mid}$ = 4.99999986 e − 001;

SET II

Where
N=47, number of non-zero coefficients=25, pass-band ripple=0.000755 dB,
stop-band ripple=−81.2 dB,
output efficiency=12.5 multiplications.
half-band polyphase filter coefficients:

$h_{mul}$ =
−1.9800863e − 004, 5.7681745e − 004, −1.3521718e − 003,
2.7292403e − 003, 2.7292403e − 003,
−4.9882732e − 003, 8.4996084e − 003, −1.3788676e − 002,
2.1713317e − 002, −3.3980190e − 002,
5.4944993e − 002, −1.0065750e − 001, 5.4944993e − 002,
−3.3980190e − 002, 2.1713317e − 002,
−1.37886766e − 002, 8.4996084e − 003, −4.9882732e − 003,
−4.9882732e − 003,
2.7292403e − 003, −1.3521718e − 003, 5.7681745e − 004,
−1.9800863e − 004 };
$h_{mid}$ = 5.0000000e − 001;

SET III

Where
N=39, number of non-zero coefficients=21, pass-band ripple=0.003 dB, stop-band ripple=−69.4 dB,
output efficiency=10.5 multiplications.

$h_{mul}$ = {
−6.38729079e − 004, 1.630717907e − 003, −3.54949336e − 003,
6.77.10956e − 003,
6.77310956e − 003, −1.18821092e − 002, 1.97808231e − 002,
−3.22043423e − 002,
5.35111761e − 002, −9.97249466e − 002, 3.16133871e − 001,
3.16133871e − 001,
−.97249466e − 002, 5.35111761e − 002, −3.22043423e − 002,
1.97808231e − 002,
−1.188210922e − 002, 6.77310956e − 003, −3.54949336e − 003,
1.63071907e − 003,
−6.38729079e − 004};
$h_{mid}$ = 4.99999986e − 001;

It should be understood that the implementation of other variations and modifications of the invention in its various aspects will be apparent to those of ordinary skill in the art, and that the invention is not limited by the specific embodiments described. For example, the filter may be used in any audio application requiring audio rate conversion, such as in telecommunications systems that utilize varying sampled rate of audio. It is therefore contemplated to cover by the present invention, any and all modifications, variations, or equivalents that fall within the spirit and scope of the basic underlying principles disclosed and claimed herein.

What is claimed is:

1. An audio sampling rate conversion filter for converting audio signals from a first sampled rate to a second sampled rate comprising:

multi-coefficient subfilter means for receiving a plurality of audio signal samples from buffer memory obtained by sampling at the first sampled rate, and for performing convolution on the plurality of audio signal samples to generate a multi-coefficient based convolution product; and single coefficient subfilter means for only receiving a middle sample from the buffer memory and for performing convolution on the middle sample using a single middle coefficient to generate a single middle coefficient based convolution product, wherein the multi-coefficient based convolution product and the single middle coefficient based convolution product are used to convert the audio signal samples obtained at the first sampled rate to audio signal samples corresponding to signal samples obtained as if sampled at the second sampled rate.

2. The audio sampling rate conversion filter of claim 1 wherein the multi-coefficient subfilter and the single coefficient subfilter are configured to perform 1:2 interpolation.

3. The audio sampling rate conversion filter of claim 2 further comprising a commutator, coupled to receive the multi-coefficient based convolution product and the single middle coefficient based convolution product wherein the commutator first outputs the multi-coefficient based convolution product and subsequently outputs the single middle coefficient based convolution product to perform the 1:2 interpolation.

4. The audio sampling rate conversion filter of claim 3 wherein the buffer is sized to store a same number of audio signal samples as a number of coefficients in the multi-coefficient subfilter.

5. The audio sampling rate conversion filter of claim 3 further including timer means for controlling when the commutator switches to pass either the multi-coefficient based convolution product or the single middle coefficient based convolution product and wherein the buffer is a single buffer that stores the audio signal sample data for both the multi-coefficient subfilter means and the single coefficient subfilter means.

6. The audio sampling rate conversion filter of claim 5 wherein the filter is in a DSP that serves a component in an audio playback device in a multimedia computer system for mixing the sampled audio signals with other sampled audio signals.

7. The audio sampling rate conversion filter of claim 1 wherein the multi-coefficient subfilter and the single coefficient subfilter are configured to perform 2:1 decimation.

8. The audio sampling rate conversion filter of claim 7 wherein the buffer memory includes:

at least two separate memory sections wherein one section stores sampled signal data for the multi-coefficient subfilter and another section stores sampled signal data for the single coefficient subfilter;

commutator means, operatively coupled to both separate memory sections for selectively directing received audio signal samples to one or the other of the separate memory sections; and adder means, coupled to receive the multi-coefficient based convolution product and the single middle coefficient based convolution product, for adding the multi-coefficient based convolution product to the single middle coefficient based convolution product to perform 2:1 decimation.

9. An audio sampling rate conversion filter comprising:

(a) a 1:2 interpolation filter stage including:

a first multi-coefficient subfilter means for receiving a plurality of audio signal samples from buffer memory, and for performing convolution on the plurality of audio signal samples to generate a first multi-coefficient based convolution product;

a first single coefficient subfilter means for only receiving a middle sample from the buffer memory and for performing convolution on the middle sample using a single middle coefficient to generate a first single middle coefficient based convolution product;

a first commutator, coupled to receive the first multi-coefficient based convolution product and the first single middle coefficient based convolution product wherein the first commutator first outputs the first multi-coefficient based convolution product and subsequently outputs the first single middle coefficient based convolution product to perform the 1:2 interpolation; and (b) a 2:1 decimator filter stage including:

a second multi-coefficient subfilter means for receiving a plurality of second audio signal samples from a second buffer memory, and for performing convolution on the second plurality of audio signal samples to generate a second multi-coefficient based convolution product;

a second single coefficient subfilter means for only receiving a second middle sample from a third buffer memory and for performing convolution on the second middle sample using a second single middle coefficient to generate a second single middle coefficient based convolution product;

a second commutator means, operatively coupled to the second and third buffer memories, for selectively directing a second set of received audio signal samples to one or the other of the second and third buffer memories; and adder means, coupled to receive the second multi-coefficient based convolution product and the second single middle coefficient based convolution product, for adding the second multi-coefficient based convolution product to the second single middle coefficient based convolution product to perform 2:1 decimation.

10. The audio sampling rate conversion filter of claim 9 wherein the first buffer is sized to store a same number of audio signal samples as a number of coefficients in the first multi-coefficient subfilter.

11. The audio sampling rate conversion filter of claim 9 wherein the 1:2 interpolation filter stage further includes timer means for controlling when the first commutator switches to pass either the first multi-coefficient based convolution product or the first single middle coefficient based convolution product and wherein the first buffer is a single buffer that stores the audio signal sample data for both the first multi-coefficient subfilter means and the first single coefficient subfilter means.

12. The audio sampling rate conversion filter of claim 9 wherein the filter is in a DSP that serves as a component in an audio playback device in a multimedia computer system for mixing the sampled audio signals with other sampled audio signals.

* * * * *